US008260387B2

(12) United States Patent
Martchevskii

(10) Patent No.: US 8,260,387 B2
(45) Date of Patent: Sep. 4, 2012

(54) SUPERCONDUCTING ARTICLES AND METHODS OF FABRICATION THEREOF WITH REDUCED AC MAGNETIC FIELD LOSSES

(75) Inventor: Maxim Martchevskii, Houston, TX (US)

(73) Assignee: Superpower, Inc., Schenectady, NY (US)

( * ) Notice: Subject to any disclaimer, the term of this patent is extended or adjusted under 35 U.S.C. 154(b) by 1041 days.

(21) Appl. No.: 12/351,051

(22) Filed: Jan. 9, 2009

(65) Prior Publication Data
US 2010/0179063 A1  Jul. 15, 2010

(51) Int. Cl.
*H01L 39/24* (2006.01)
(52) U.S. Cl. .......................... 505/230; 505/231; 505/232
(58) Field of Classification Search .................. 505/230, 505/231, 232
See application file for complete search history.

(56) References Cited

U.S. PATENT DOCUMENTS

| 7,109,151 | B2 | 9/2006 | Lee et al. |
| 7,109,425 | B2 | 9/2006 | Reis et al. |
| 2004/0265649 | A1 | 12/2004 | Selvamanickam |
| 2005/0164889 | A1 | 7/2005 | Selvamanickam |
| 2007/0238619 | A1 | 10/2007 | Xiong |

OTHER PUBLICATIONS

Genenko et al., "Large Predicted Self-Field Critical Current Enhancements in Superconducting Strips Using Magnetic Screens", Physical Review Letters, vol. 83, No. 15 (Oct. 11, 1999).

Yurchenko et al., "Magneto-Optical Investigations of Ag-Sheathed Bi-2223 Tapes with Ferromagnetic Shielding", Proceedings of the 8th International Conference on Materials and Mechanism of Superconductivity and High Temperature Superconductors, Dresden, Germany (Jul. 9-14, 2006).
Genenko et al., "Overcritical States of a Superconductor Strip in a Magnetic Environment", Physical Review B, vol. 62, No. 5 (Aug. 1, 2000).
Glowacki et al., "A Method for Decreasing Transport AC Losses in Multifilamentary and Multistrip Superconductors", IOP Electronic Journal, Superconductor Science and Technology, http://www.iop.org/EJ/abstract/0953-2048/13/7/311 (Dec. 9, 2008).
Zhang et al., "Method of Forming A Multifilament AC Tolerance Conductor with Striated Stabilizer, Articles Related to the Same, and Devices Incorporating the Same", U.S. Appl. No. 11/487,204, filed Jul. 14, 2006.

*Primary Examiner* — Edward Cain
(74) *Attorney, Agent, or Firm* — Kevin P. Radigan, Esq.; Heslin Rothenberg Farley & Mesiti P.C.

(57) ABSTRACT

A superconducting article is provided which includes a superconducting tape assembly. The superconducting tape assembly includes a superconducting tape layer, having one or more superconducting tapes, and a high-permeability magnetic material layer coupled to the superconducting tape layer. The high-permeability magnetic material layer includes a high-permeability magnetic material which remains magnetically soft at a critical temperature $T_c$ of the superconducting tape, and with presence of an ac magnetic field acting on the superconducting tape assembly, re-magnetizes to divert at least a portion of a normal component of the ac magnetic field therethrough, which reduces ac loss in the superconducting tape layer by modifying the ac magnetic field distribution within the superconducting tape of the superconducting tape layer.

20 Claims, 9 Drawing Sheets

SUPERCONDUCTING ARTICLES AND METHODS OF FABRICATION THEREOF WITH REDUCED AC MAGNETIC FIELD LOSSES

TECHNICAL FIELD

The present invention relates in general to superconducting articles, and in particular, to a superconducting article (comprising a superconducting tape assembly) and methods of fabrication thereof, wherein reduced hysteretic ac losses are obtained by incorporating therein one or more high permeability magnetic material layers.

BACKGROUND OF THE INVENTION

Superconductor materials have long been known and understood by the technical community. Low-temperature (low-$T_c$) superconductors exhibiting superconductive properties at temperatures requiring use of liquid helium (4.2° K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77° K) was discovered, namely $YBa_2Cu_3O_{7-x}$ (YBCO), followed by development of additional materials over the past 15 years, including $Bi_2Sr_2Ca_2Cu_3O_{10+y}$ (BSCCO), and others. The development of high-$T_c$ superconductors has brought potentially, economically feasible development of superconductors with liquid nitrogen, rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one or two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the many challenges associated with the commercialization of high temperature superconductors, there remains the technical challenge in the power industry of fabricating HTS cables and devices in such a way that they operate with negligible alternating current (ac) losses. AC current is the dominant form in most of the world's power cable-based devices, and ac applications of HTS tapes operate with non-negligible energy losses, with the energy escaping in the form of heat. This impacts the efficiency of the system beyond mere energy loss since the heat generated must be removed from the environment of the device.

Superconductors operate in the temperature range of 4°-85° K, far below ambient temperature (298° K). Thus, superconductors require refrigeration, and refrigeration requires continuous expenditure of energy, for example, if the heat caused by the electrical current flowing in superconductor wires is at 77° K and is dissipated at the rate of 1 Watt, then refrigerators must be supplied with approximately 10-40 Watts of electrical power to dissipate that generated heat. Absent this refrigeration, the superconductor would warm itself to above its superconducting temperature and cease to operate as a superconductor, thereby eliminating any advantage and, in particular, providing worse performance than conventional copper conductors.

The heat generated must be eliminated to cost-effectively maintain low temperatures required by the superconductor. A successful solution to this problem would reduce operating costs by reducing the added cooling energy needed. One significant problem with HTS tapes is that unwanted ac magnetic fields are generated by the current flowing in the neighboring HTS tapes which causes ac losses. Because the HTS tape material and geometry is anisotropic, magnetic fields passing perpendicular to the preferred direction generates significantly greater losses than those of parallel fields.

In view of the foregoing, there exists a need for improved superconductors, and in particular, in the provision of commercially viable superconducting tapes, as well as methods for forming the same, and power components utilizing such superconductor tapes.

SUMMARY OF THE INVENTION

Accordingly, in one aspect, the present invention comprises a superconducting article, which includes a superconducting tape assembly. The superconducting tape assembly includes a superconducting tape layer, comprising at least one superconducting tape, and a high-permeability magnetic material layer coupled thereto. The high-permeability magnetic material layer includes a high-permeability magnetic material which remains magnetically soft at a critical temperature $T_c$ of the at least one superconducting tape, and with presence of an ac magnetic field acting on the superconducting tape assembly, re-magnetizes to divert at least a portion of a normal component of the ac magnetic field therethrough, thereby reducing ac loss in the superconducting tape layer by modifying ac magnetic field distribution within the at least one superconducting tape.

In a further aspect, a method of fabricating a superconducting article is provided. The method includes: forming a superconducting tape assembly by: providing a superconducting tape layer comprising at least one superconducting tape; and affixing a high-permeability magnetic material layer to the superconducting tape layer, wherein the high-permeability magnetic material layer comprises a high-permeability magnetic material which remains magnetically soft at a critical temperature $T_c$ of the at least one superconducting tape, and with presence of an ac magnetic field acting on the superconducting tape assembly, re-magnetizes to divert at least a portion of a normal component of the ac magnetic field therethrough, thereby reducing ac loss in the superconducting tape assembly by modifying ac magnetic field distribution within the at least one superconducting tape.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
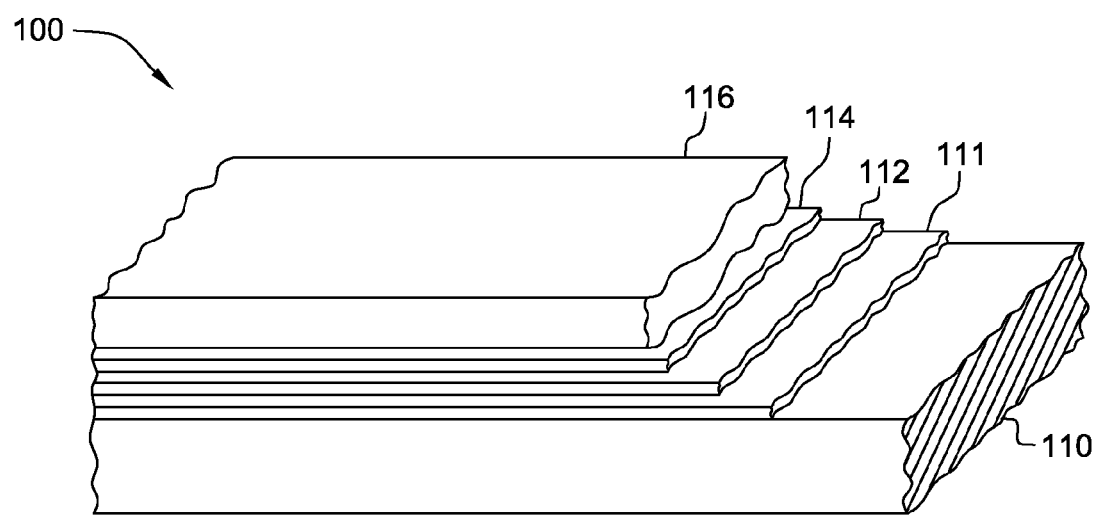
FIG. 1 illustrates one embodiment of a high temperature superconducting tape to be employed in a superconducting tape assembly, in accordance with an aspect of the present invention.

Referring to FIG. 1, the general layered structure of an HTS conductor 100 is depicted which can be employed in a superconducting tape assembly, in accordance with the present invention. The HTS conductor 100 includes a substrate 110, a buffer layer 111 overlying substrate 110, an HTS layer 112, followed by a capping layer 114, (typically a noble metal layer) and a stabilizer layer 116 (typically a non-noble metal). In the embodiment depicted in FIG. 1, buffer layer 111, HTS layer 112, capping layer 114 and stabilizer layer 116 are collectively referred to as the superconducting region, which as illustrated, is disposed along one main surface of substrate 110.

The substrate 110 is typically in a tape-like configuration, having a high aspect ratio. For example, the width of the tape is generally on the order of about 0.4-10 cm, and the length of the tape is typically at least about 100 m, most typically greater than about 500 m. Accordingly, the substrate may have an aspect ratio which is fairly high, on the order of not less than $10^3$, or even not less than $10^4$. Certain embodiments are longer, having an aspect ratio of $10^5$ and higher. As used herein, the term 'aspect ratio' is used to denote the ratio of the length of the substrate or tape to the next longest dimension, that is, the width of the substrate or tape.

In one embodiment, the substrate is treated so as to have desirable surface properties for subsequent deposition of the constituent layers of the HTS tape. For example, the surface may be lightly polished to a desired flatness and surface roughness. Additionally, the substrate may be treated to be biaxially textured as is understood in the art, such as by the known RABiTS (roll assisted biaxially textured substrate) technique.

Turning to buffer layer 111, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is an acronym for Ion Beam Assisted Deposition, a technique which may be advantageously utilized to form a suitably textured buffer layer for subsequent formation of an HTS layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, which is incorporated herein by reference in its entirety.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride and silicon carbide. Suitable techniques for deposition of a barrier film include chemical vapor deposition and physical vapor deposition including sputtering. Typical thicknesses of the barrier film may be within a range of about 100-200 angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconducting layer exists. Accordingly, the buffer layer may further include another buffer film, this one in particular implemented to reduce a mismatch in lattice constants between the HTS layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

High-temperature superconductor (HTS) layer 112 is typically chosen from any of the high-temperature superconducting materials that exhibit superconducting properties above the temperature of liquid nitrogen, 77° K Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The HTS layer 112 may be formed by anyone of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the HTS layer has a thickness on the order of about 1 to about 30 microns, most typically about 2 to about 20 microns, such as about 2 to about 10 microns, in order to get desirable amperage ratings associated with the HTS layer 112.

Capping layer 114 and stabilizer layer 116 are generally implemented for electrical stabilization, that is, to aid in prevention of HTS burnout in practical use. More particularly, layers 114 and 116 aid in continued flow of electrical charges along the HTS conductor in cases where cooling fails or the critical current density is exceeded, and the HTS layer moves from the superconducting state and becomes resistive. Typically, a noble metal is utilized for capping layer 114 to prevent unwanted interaction between the stabilizer layer(s) and the HTS layer 112. Typical noble metals include gold, silver, platinum, and palladium. Silver is typically used due to its cost and general accessibility. Capping layer 114 is typically made to be thick enough to prevent unwanted diffusion of the components from stabilizer layer 116 into HTS layer 112, but is made to be generally thin for cost reasons (raw material and processing costs). Typical thicknesses of capping layer 114 range within about 0.1 to about 10.0 microns, such as 0.5 to about 5.0 microns. Various techniques may be used for deposition of capping layer 114, including physical vapor deposition, such as DC magnetron sputtering.

According to a particular feature of an embodiment of the present invention, stabilizer layer 116 is incorporated, to overlie the superconducting layer 112, and in particular, overlie and directly contact capping layer 114 in the embodiment shown in FIG. 1. Stabilizer layer 116 functions as a protection/shunt layer to enhance stability against harsh environmental conditions and superconductivity quench. The layer is generally dense and thermally and electrically conductive, and functions to bypass electrical current in case of failure in the superconducting layer. Conventionally, such layers have been formed by laminating a pre-formed copper strip onto the superconducting tape, by using an intermediary bonding material such as a solder or flux. Other techniques have focused on physical vapor deposition, typically, sputtering. However, such application techniques are costly, and not particularly economically feasible for large-scale production operations. According to a particular feature of the embodiment, stabilizer layer 116 is formed by electroplating. According to this technique, electroplating can be used to quickly build-up a thick layer of material on the superconducting tape, and it is a relatively low cost process that can effectively produce dense layers of thermally and electrically conductive metals. According to one feature, the stabilizer layer is deposited without the use of or reliance upon and without the use of an intermediate bonding layer, such as a solder layer (including fluxes) that have a melting point less than about 300° C.

Electroplating (also known as electrodeposition) is generally performed by immersing the superconductive tape in a solution containing ions of the metal to be deposited. The surface of the tape is connected to an external power supply and current is passed through the surface into the solution, causing a reaction of metal ions ($M^{z-}$) with electrons ($e^-$) to form a metal (M), wherein:

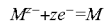

$$M^{z+} + ze^- = M$$

Capping layer 114 functions as a second layer for deposition of copper thereon. In the particular case of electroplating of stabilizer metals, the superconductive tape is generally immersed in a solution containing cupric ions, such as in a copper sulfate solution. Electrical contact is made to capping layer 114 and current is passed such that the reaction $Cu^{2+} + 2e^- \rightarrow Cu$ occurs at the surface of capping layer 114. The capping layer 114 functions as the cathode in the solution, such that the metal ions are reduced to Cu metal atoms and deposited on the tape. On the other hand, a copper-containing anode is placed in the solution, at which an oxidation reaction occurs such that copper ions go into solution for reduction and deposition at the cathode.

In the absence of any secondary reactions, the current delivered to the conductive surface during electroplating is directly proportional to the quantity of metal deposited (Faraday's Law of Electrolysis). Using this relationship, the mass, and hence thickness of the deposited material forming stabilizer layer 116 can be readily controlled.

While the foregoing generally references copper, it is noticed that other metals, including aluminum, silver, gold, and other thermally and electrically conductive metals may also be utilized. However, it is generally desirable to utilize a non-noble metal to reduce overall materials cost for forming the superconductive tape.

While the foregoing description and FIG. 1 describes electroplating to form stabilizer layer 116 along one side of the superconductive tape, it is also noted that the opposite, major side of the superconductive tape may also be coated, and indeed, the entirety of the structure can be coated so as to be encapsulated. Those skilled in the art will note that the above-description of HTS conductor 100 in FIG. 1 is provided by way of example only. The superconducting tape assemblies described hereinbelow may utilize any appropriate superconducting tape, for example, any high-temperature superconducting tape having a critical temperature $T_c$ not less than about 77° K.

Figure 2:
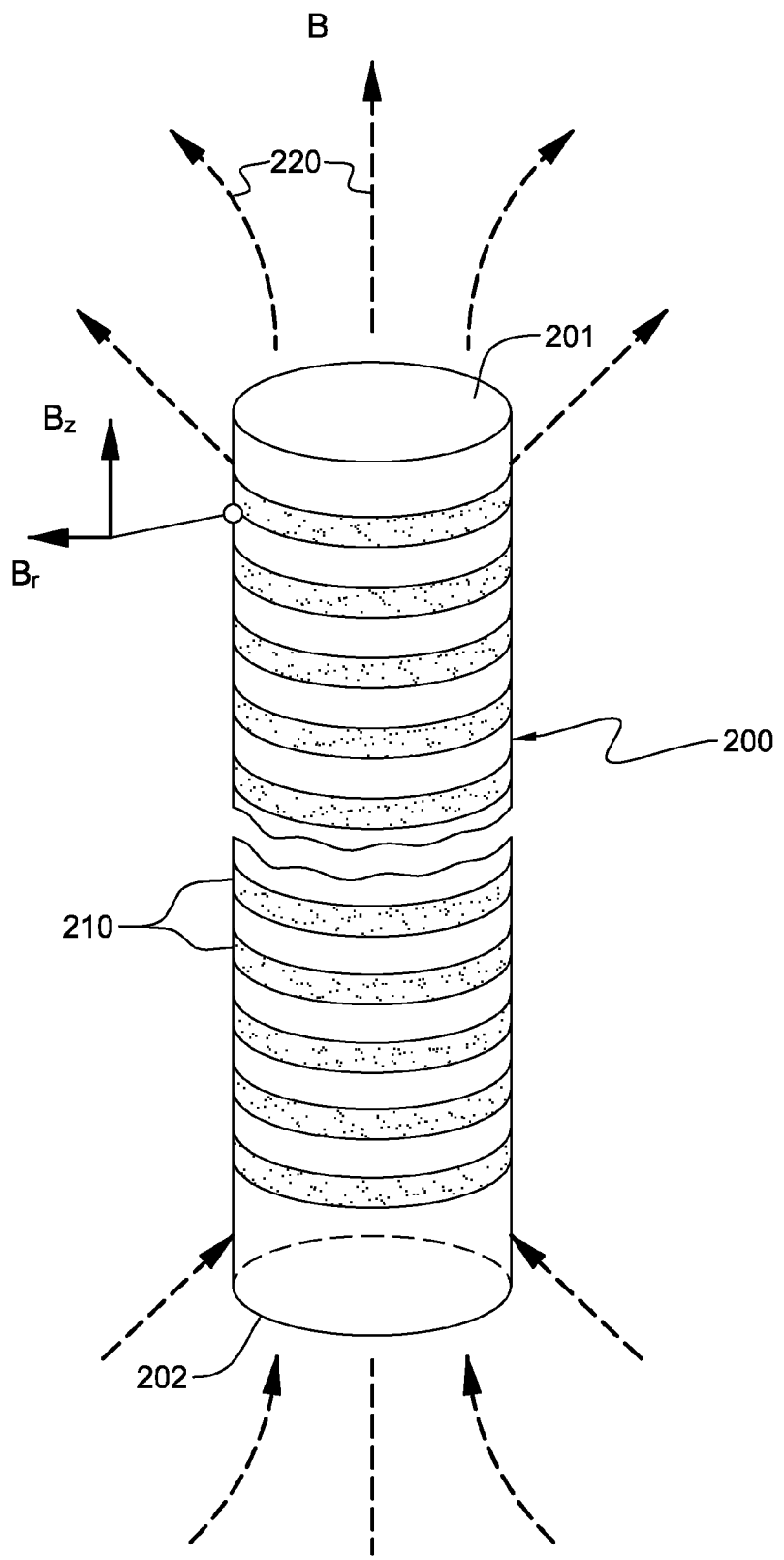
FIG. 2 illustrates one embodiment of a superconducting coil (e.g., a solenoid), wound with a high-temperature superconducting tape, such as illustrated in FIG. 1, with presence a magnetic field distribution as illustrated and with ac losses in the coil to be reduced by the superconducting tape assemblies disclosed herein, in accordance with an aspect of the present invention.

AC loss is a significant issue when superconductors are used for applications where current or magnetic field vary in time. The reason for this is that the motion of the flux lines, or change in the magnetic field distribution, causes dissipation within the superconducting tape. As shown in FIG. 2, a coil (e.g., a solenoid) 200, formed by winding a superconducting tape 210, may have a magnetic field distribution B 220 as illustrated. Near an upper end 201 and a lower end 202 of the coil, there will be a radial component $B_r$ of the magnetic field that is normal to the surface of superconducting tape 210. This normal component to the superconducting tape would typically lead to an increased ac hysteretic loss in the coil. Presented herein, however, is a superconducting tape assembly which incorporates a magnetic screen, referred to herein as a high-permeability magnetic material layer, to reduce adverse effects of this transverse field, and thus reduce the net ac hysteretic loss of the coil. More particularly, described hereinbelow is the reduction of ac hysteretic losses in HTS superconductors (such as 2G HTS superconductors) by means of a superconducting tape assembly incorporating high-permeability magnetic material screening of the superconductor.

Figure 3A:
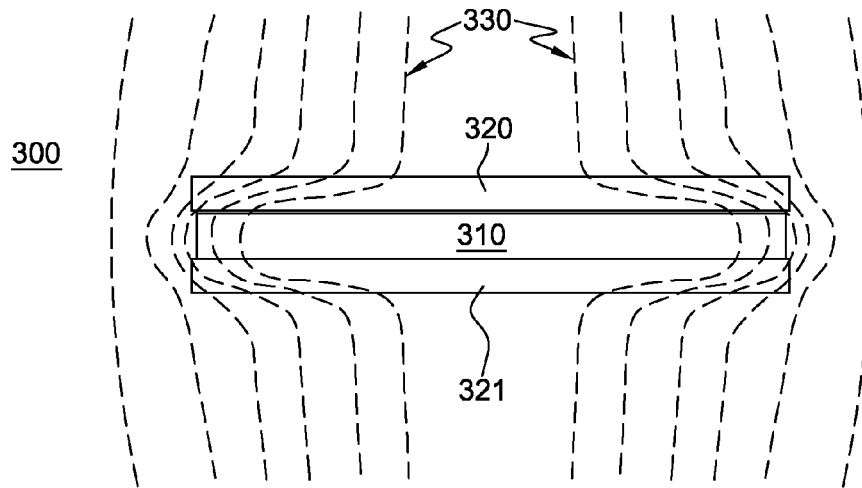
FIG. 3A is a cross-sectional elevational view of one embodiment of a low-hysteretic ac loss superconducting tape assembly, in accordance with an aspect of the present invention.

FIG. 3A is a cross-sectional elevational view of one embodiment of a superconducting tape assembly, generally denoted 300, in accordance with an aspect of the present invention. Superconducting tape assembly 300 is shown to include a superconducting tape layer 310 sandwiched, in this embodiment, between a first high-permeability magnetic material layer 320 and a second high-permeability magnetic material layer 321. In one embodiment, these high-permeability magnetic material layers 320, 321 may comprise thin foils of high-permeability ferromagnetic material which functions to screen and redirect external ac magnetic field acting 330 on superconducting tape layer 310, as illustrated by the re-directed magnetic field lines. Specifically, the normal component of magnetic field 330 is diverted, at least partially, by the high-permeability magnetic material layers 320, 321, to a direction parallel to a main surface of superconducting tape layer 310, thereby reducing ac loss in the superconducting tape layer by modifying the ac magnetic field distribution within the superconducting tape. Superconducting tape layer 310 may comprise one or more discrete superconducting tapes, depending on the implementation.

As explained above, hysteretic ac losses in the superconducting tape layer occur due to the motion of the flux lines in response to the external ac field that causes dissipation. The dissipation power (or power loss) is generally given by:

$$P = \mu_0 f \oint M(H) dH$$

Where integration is around a full magnetization cycle, P is the power loss, $\mu_0$ is a constant, f is the frequency of the ac field, M is the magnetization, which is a function of the applied magnetic field H. By reducing the applied magnetic field H acting on the superconducting tape, and changing the effective cross-section of the flux penetration, as illustrated in FIG. 3A, it is possible to reduce ac power loss in the superconducting tape layer.

As illustrated, once high-permeability magnetic material is placed near one or both of the main surfaces of the superconducting tape layer, the external field component normal to the tape layer is partially guided away from the interior of the tape layer, towards its sides. Also, the direction of the field has changed so that it is mostly parallel to the main surfaces of the superconducting tape layer. Both effects work together towards a significant reduction in ac field penetration of the superconducting volume or region, resulting in the corresponding reduction of ac loss. In one example, each high-permeability magnetic material layer, 320, 321 (FIG. 3A) comprises a screen of two sheaths (or thin foils) of high-permeability magnetic material. As used herein, "high-permeability" refers to a magnetic permeability at room temperature of at least 10,000.

In order to graphically illustrate the effect of the magnetic material layers on ac loss reduction, the specific shielding configurations described herein combine the following properties: a very high magnetic permeability, also at 77° K, a small magnetic hysteresis (low ferromagnetic ac loss), a high electrical resistivity (low eddy current loss), good mechanical stability, and low cost. Ferromagnetic metal glasses, produced by a number of companies, such as Metglas, Inc., of Conway, S.C., possess the above-noted properties, and thus are good candidates for use as magnetic shields in a manner described herein. In the examples described below, a ferromagnetic glass alloy, such as Metglas "SA01" or Metglas "2714A" may be used. In the specific examples described herein, Metglas "SA01" was chosen for its lower cost. The magnetic permeability of Metglas "SA01" at room temperature is ≈45000. The foil used in the graphical comparisons discussed herein had a thickness of 0.001 inch. Layers of magnetic material were affixed with a Kapton adhesive foil to the superconducting tape layer. Several configurations have been investigated (as illustrated further in connection with FIGS. 4A-5B). In the first demonstration, a 40 mm long and 12 mm wide piece of HTS superconducting tape, with transport critical current $I_c$=215 A, was stacked with two 40×12 mm Metglas "SA01" foils on each side. AC loss with and without the magnetic screens was measured, based on measurement of complex ac susceptibility of the sample.

Figure 3B:
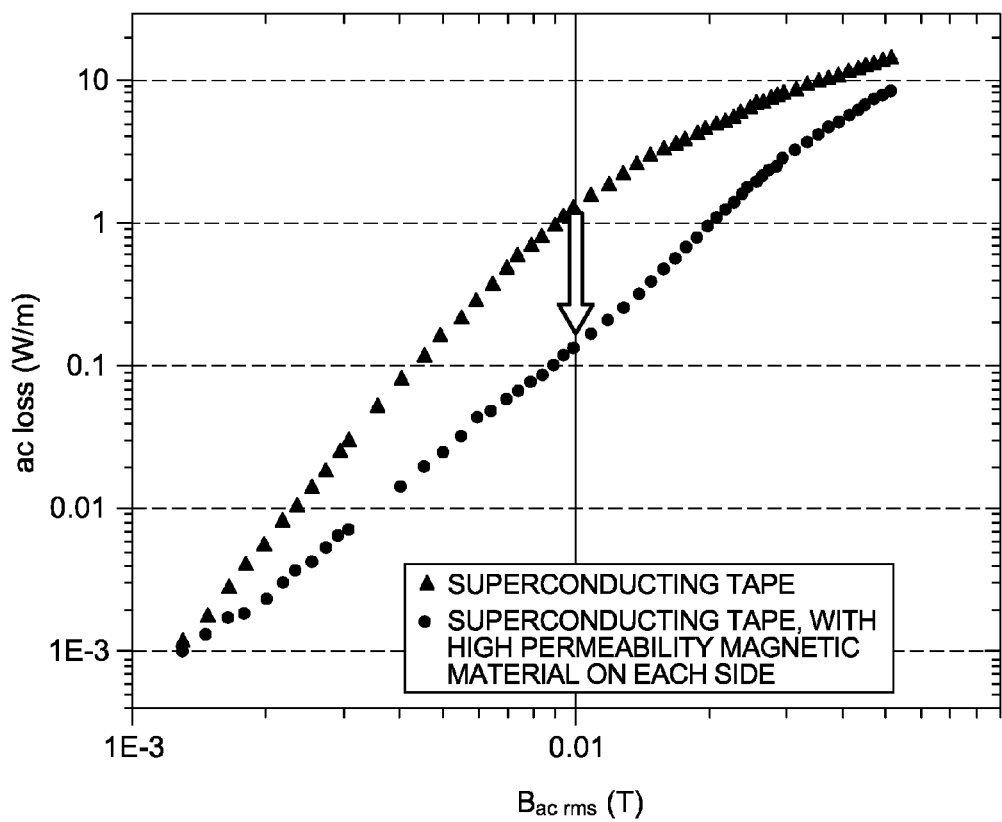
FIG. 3B graphically depicts ac losses for a conventional high temperature superconducting tape compared with a superconducting tape assembly such as depicted in FIG. 3A plotted against the strength of the ac magnetic field acting thereon in a direction perpendicular thereto, in accordance with an aspect of the present invention.

FIG. 3B illustrates experimental results for the superconducting tape assembly of FIG. 3A. In FIG. 3B, ac loss in a single HTS conductor (both without and with the magnetic screens made of a double layer of "SA01" foil at each side) is illustrated. The ac loss, in watts per meter, is plotted against the ac magnetic field strength applied perpendicular to the HTS conductor, with field strength being an RMS value in teslas. As noted in FIG. 3B, approximately a 10× loss reduction is achieved near ≈100 G r.m.s. ac magnetic field strength. The frequency of the ac field was 100 Hz in this example.

Figure 4A:
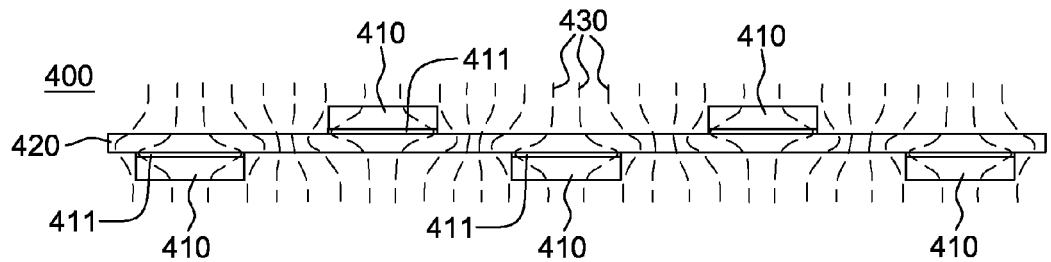
FIG. 4A is a cross-sectional elevational view of an alternate embodiment of a low-hysteretic ac loss superconducting tape assembly, in accordance with an aspect of the present invention.

FIG. 4A depicts one embodiment of a multi-filament superconducting tape assembly 400 configuration. In this example, five 2 mm wide and 40 mm long HTS conductors 410 with transport current $I_C$ in the range of 22-25 A were affixed to a high-permeability magnetic material layer 420, with the superconducting regions 411 of the conductors disposed adjacent and in opposing relation to main surfaces of the high-permeability magnetic material layer. As a specific example, the high-permeability magnetic material layer may comprise a single sheath of Metglas "SA01" foil, for example, 12 mm wide and 40 mm long. This high-permeability magnetic material layer functions as the base for the multi-filamentary superconducting tape assembly, as illustrated. In the embodiment of FIG. 4A, an ac magnetic field 430 is shown with a (normal) component acting on the superconducting tape assembly from a direction perpendicular to a main surface thereof, and more particularly, perpendicular to the individual HTS conductors 410 of superconducting tape assembly 400. In producing the superconducting tape assembly of FIG. 4A, the individual superconducting tapes may be attached to the high-permeability magnetic material layer using an adhesive foil, such as the above-noted Kapton tape. In a specific example, the superconducting region 411 of the superconducting tapes 410 comprises a YBCO superconductor facing the high-permeability magnetic material layer 420.

Figure 4B:
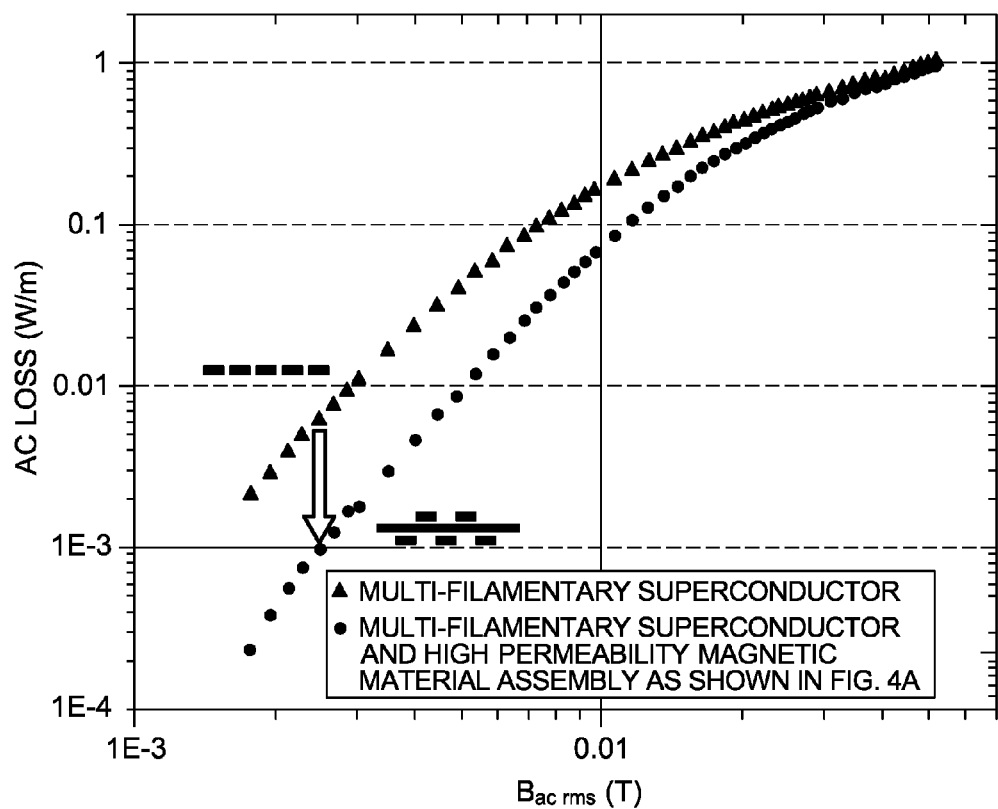
FIG. 4B graphically depicts ac losses of a conventional multi-filamentary HTS conductor compared with a low-hysteretic ac loss superconducting tape assembly such as depicted in FIG. 4A, plotted against the strength of the ac magnetic field acting thereon in a direction perpendicular thereto, in accordance with an aspect of the present invention.

FIG. 4B graphically illustrates the reduced ac loss in the superconducting tape assembly of FIG. 4A compared with a conventional multi-filamentary superconductor. In comparing the two approaches, five 2 mm wide HTS tapes were used, both with and without a high-permeability magnetic material base layer of Metglas "SA01" alloy. As illustrated, approximately an 8× loss reduction is achieved at low ac (≈20 G) magnetic fields, and an ac field frequency of 100 Hz. As shown, the maximum ac loss reduction in this configuration is achieved at the lowest applied fields of approximately 10-20 Gauss.

Figure 5A:
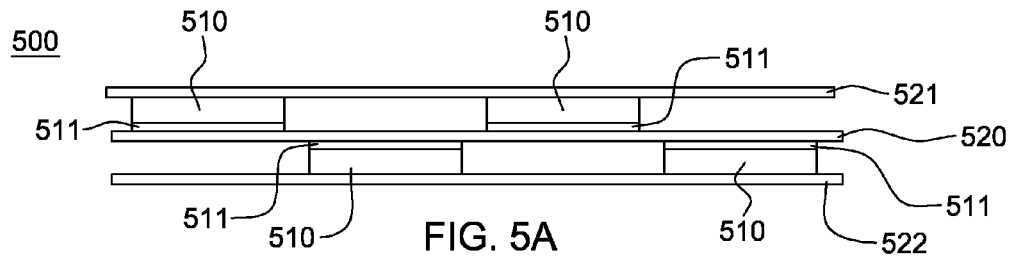
FIG. 5A is a cross-sectional elevational view of another embodiment of a low-hysteretic ac loss superconducting tape assembly, in accordance with an aspect of the present invention.

FIG. 5A illustrates one embodiment of a multi-filamentary superconducting tape assembly combining features of the superconducting tape assembly of FIG. 3A, and the superconducting tape assembly of FIG. 4A. Specifically, the superconducting tape assembly, generally denoted 500, of FIG. 5A, is shown to comprise a first superconducting tape layer 501 and a second superconducting tape layer 502. Each superconducting tape layer, in this example, includes two HTS conductors 510, having superconducting regions 511 disposed adjacent to and in opposing relation to a respective main surface of a middle high-permeability magnetic material layer 520. In addition, the superconducting tape assembly 500 includes an upper high-permeability magnetic material layer 521 and a lower high-permeability magnetic material layer 522. In this configuration, the three high-permeability magnetic material layers, each of which may comprise one or more films of ferromagnetic glass alloy, such as the above-noted "SA01" provided by Metaglas, Inc., are used to construct a tape assembly which provides both effects observed in the above-described embodiments of FIGS. 3A & 4A. By way of further example, each high-permeability magnetic material layer is assumed to comprise a 0.001 inch sheet of Metglas "SA01", and the superconducting tapes of the superconducting tape layers are each assumed to comprise YBCO tape with a transport critical current $I_c$=24-25 A.

Figure 5B:
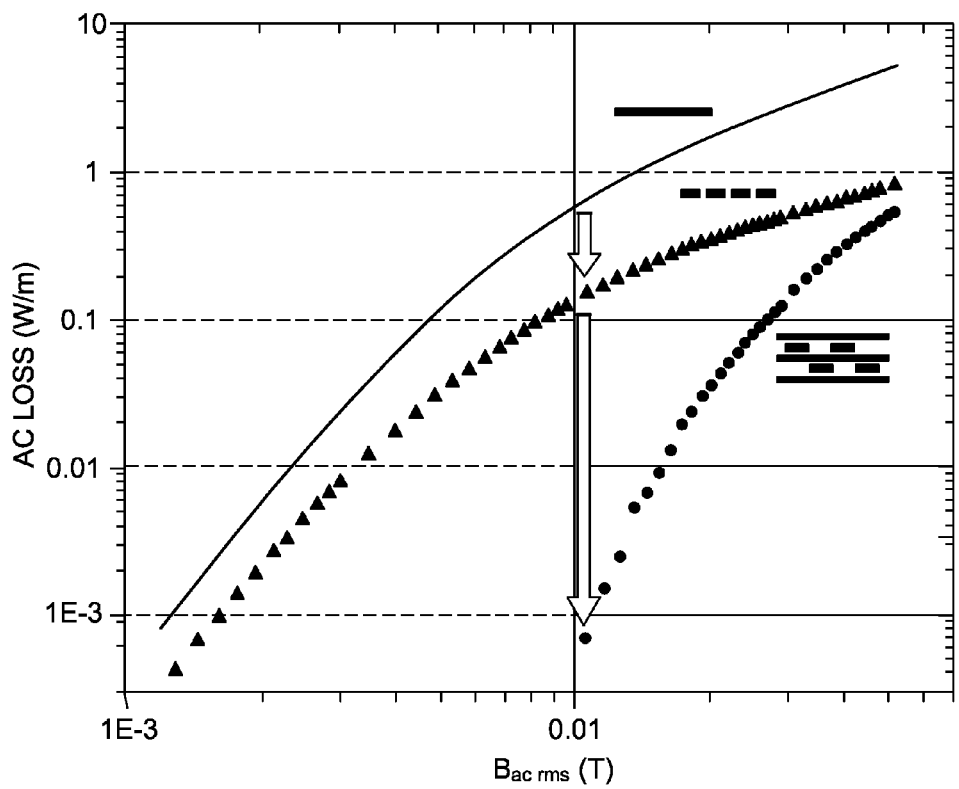
FIG. 5B graphically depicts ac losses of a single HTS conductor, a multi-filamentary HTS conductor and a low-hysteretic ac loss superconducting tape assembly such as depicted in FIG. 5A, plotted against the strength of the ac magnetic field acting thereon in a direction perpendicular thereto, in accordance with an aspect of the present invention.

As illustrated in FIG. 5B, the ac power loss of a multi-filamentary conductor made of four 2 mm wide HTS tapes in comparison with a single 8 mm wide HTS tape nets a 4× reduction in ac losses, while an approximately 850× reduction in ac loss is achieved employing a superconducting tape assembly such as depicted in FIG. 5A. In the illustrated example, the superconducting tape assembly of FIG. 5A is again assumed to be made of four 2 mm wide HTS tapes arranged in the two superconducting tape layers, along with the three high-permeability magnetic material layers, each comprising one or more ferromagnetic glass alloy foils, such as the above-discussed Metglas "SA01" alloy. An approximately 200× ac loss reduction is achieved with magnetic screening at 100 Gauss r.m.s. ac field, and the total reduction obtained with striation of the tape, plus the magnetic screening described herein, is approximately 850×, with the frequency of the field being 100 Hz.

To summarize, combining three high-permeability magnetic material layers of "SA01" alloy in the filamentary tape assembly of FIG. 5A produces over 200× reduction in ac loss. This is in addition to the approximately 4× reduction due to division of the superconductor into filaments, compared with an 8 mm tape. Thus, an approximately 850× ac loss reduction is obtained using the combination of striation and magnetic screening in a superconducting tape assembly, which is very significant. The superconducting tape assemblies described herein advantageously allow reduction in ac magnetization losses of an HTS superconducting tape by over two orders of magnitude using a technique of laminating the tape surface(s) with a soft magnetic alloy. In one example, Kapton adhesive tape may be used to combine the HTS superconductors with the magnetic foils. Longer length embodiments may utilize a continuous lamination process of the HTS tapes with the magnetic material.

Various superconducting article configurations are depicted in FIGS. 6-10 and described below. The superconducting tape assembly presented herein may be employed in one or more of these articles, particularly where there is a perpendicular magnetic field component acting on the superconducting tape assembly. For example, a superconducting tape assembly such as described herein may be used in one or more of the superconducting articles described below if a portion or all of the superconducting tape within the superconducting article experiences an ac magnetic field with a component normal to the superconducting tape surface. In such a case, the superconducting tape assembly described herein provides reduced ac loss in the superconducting tape layer by modifying ac magnetic field distribution within the superconducting tape.

Figure 6:
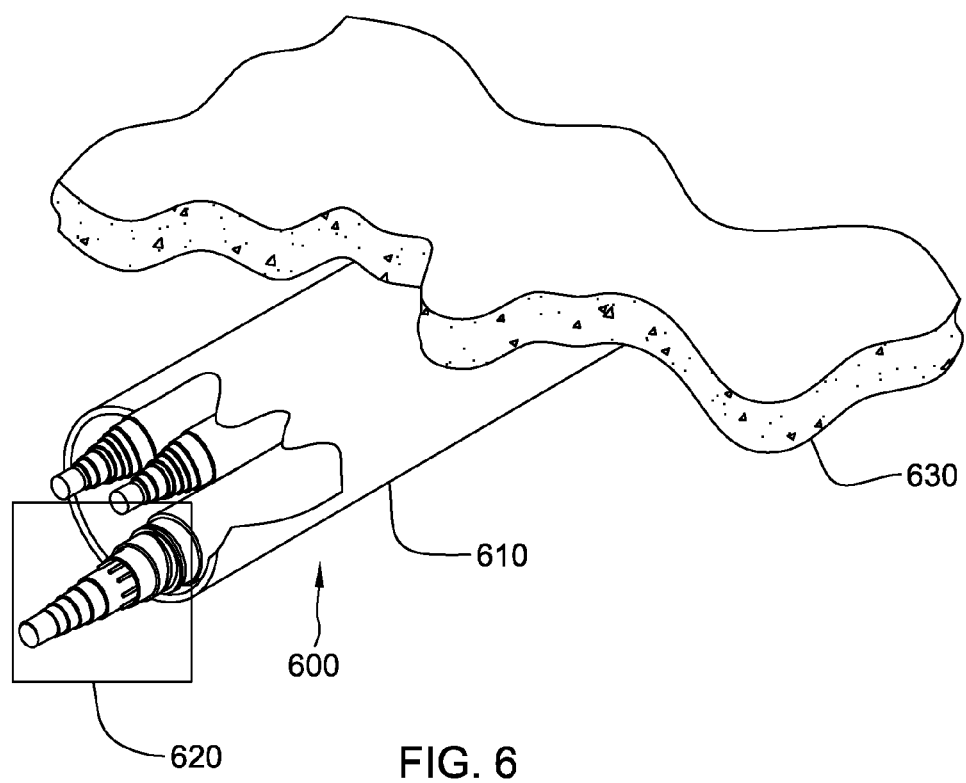
FIG. 6 is a partial cross-sectional view of one embodiment of a power cable incorporating a low-hysteretic ac loss superconducting tape assembly, in accordance with an aspect of the present invention.
Figure 7:
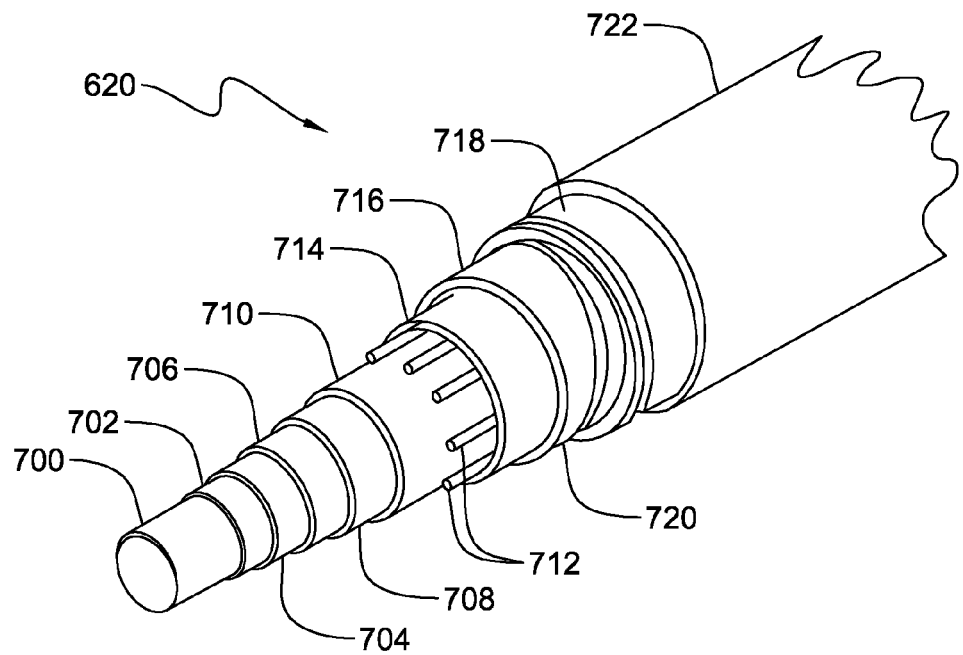
FIG. 7 is a more detailed embodiment of a power cable incorporating a low-hysteretic ac loss superconducting tape assembly, in accordance with an aspect of the present invention.

FIGS. 6 and 7 illustrate implementation of a superconducting tape assembly such as described herein within a superconducting article, namely a power cable 600. FIG. 6 illustrates several power cables 620 extending through an underground conduit 610, which may be a plastic or steel conduit, and illustrates ground 630 for clarity. As is shown, several power cables 620 may run through conduit 610.

FIG. 7 depicts a particular structure of a power cable 620. In order to provide cooling to maintain the superconductive power cable in a superconducting state, liquid nitrogen is fed through the power cable through LN2 duct 700. One or a plurality of HTS tapes 702 is/are provided so as to cover the duct 700. The tapes may be placed onto the duct 700 in a helical manner, spiraling the tape about the duct 700. Further components include a copper shield 704, a dielectric tape 706 for dielectric separation of the components, a second HTS tape 708, a copper shield 710 having a plurality of centering wires 712, a second, larger LN2 duct 714, thermal insulation 716, provided to aid in maintaining a cryogenic state, a corrugated steel pipe 718 for structural support, including skid wires 720, and an outer enclosure 722.

Figure 8:
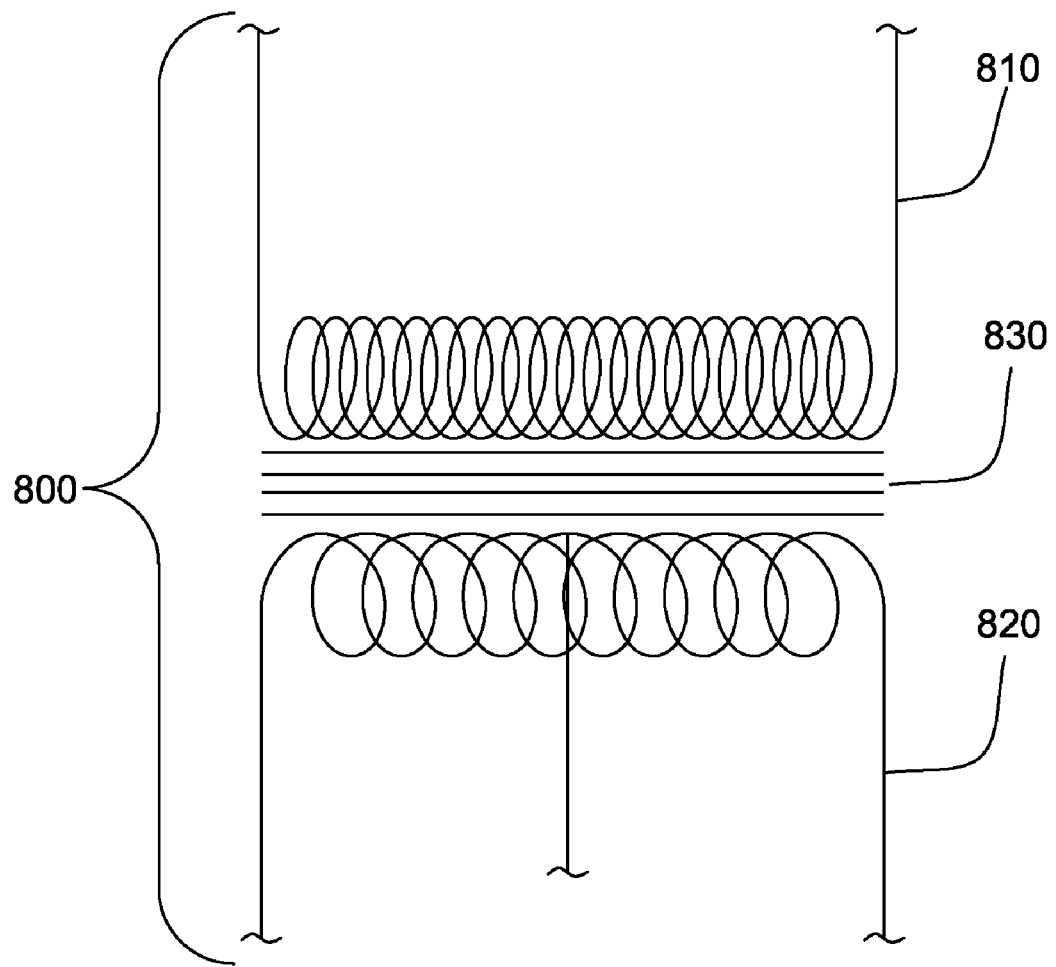
FIG. 8 illustrates one embodiment of a power transformer incorporating a low-hysteretic ac loss superconducting tape assembly, in accordance with an aspect of the present invention.

FIG. 8 illustrates schematically a power transformer 800 having a central core 830 around which a primary winding 810 and a secondary winding 820 are provided. As shown, FIG. 8 is schematic in nature, and the actual geometric configuration of the transformer may vary as is well understood in the art. As illustrated, the transformer includes the basic primary and secondary windings. In this regard, in the embodiment shown in FIG. 9, primary winding 810 has a higher number of coils than secondary winding 820, representing a step-down transformer which reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one, and possibly both, of the primary and secondary windings may comprise superconducting tape assemblies, in accordance with the foregoing description.

Figure 9:
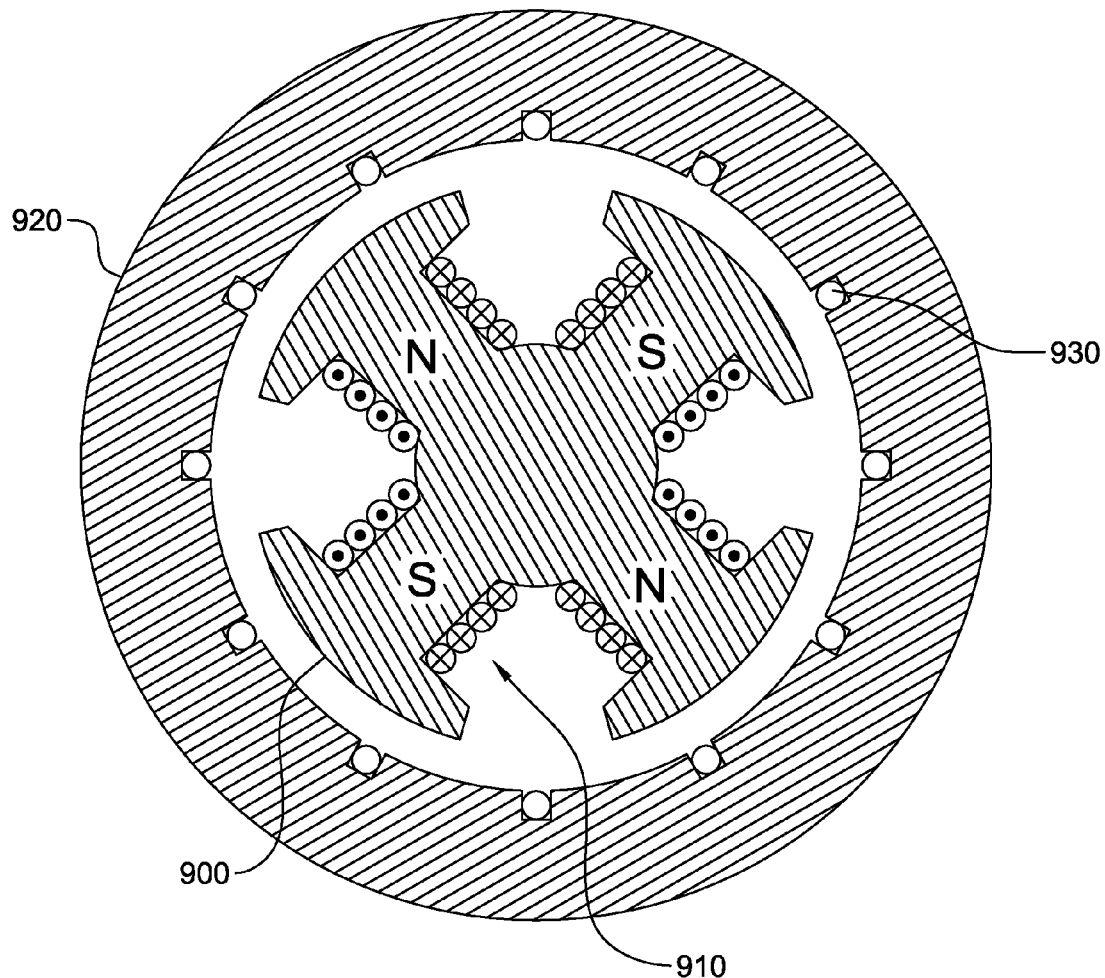
FIG. 9 illustrates one embodiment of a rotating machine incorporating a low-hysteretic ac loss superconducting tape assembly, in accordance with an aspect of the present invention.

FIG. 9 depicts the basic structure of a generator. The generator includes a rotor 900 that is driven as is known in the art, such as by a turbine. Rotor 900 includes high-intensity electromagnets, which are formed of rotor coils 910 that form the desired electromagnetic field for power generation. The generation of the electromagnetic field generates power in the stator 920, which comprises at least one conductive winding 930. According to a particular feature of the embodiment, the rotor coils and/or the stator winding comprises a superconducting tape assembly, such as described herein. Low-loss superconductors used in the stator windings generally substantially reduce hysteresis losses.

Figure 10:
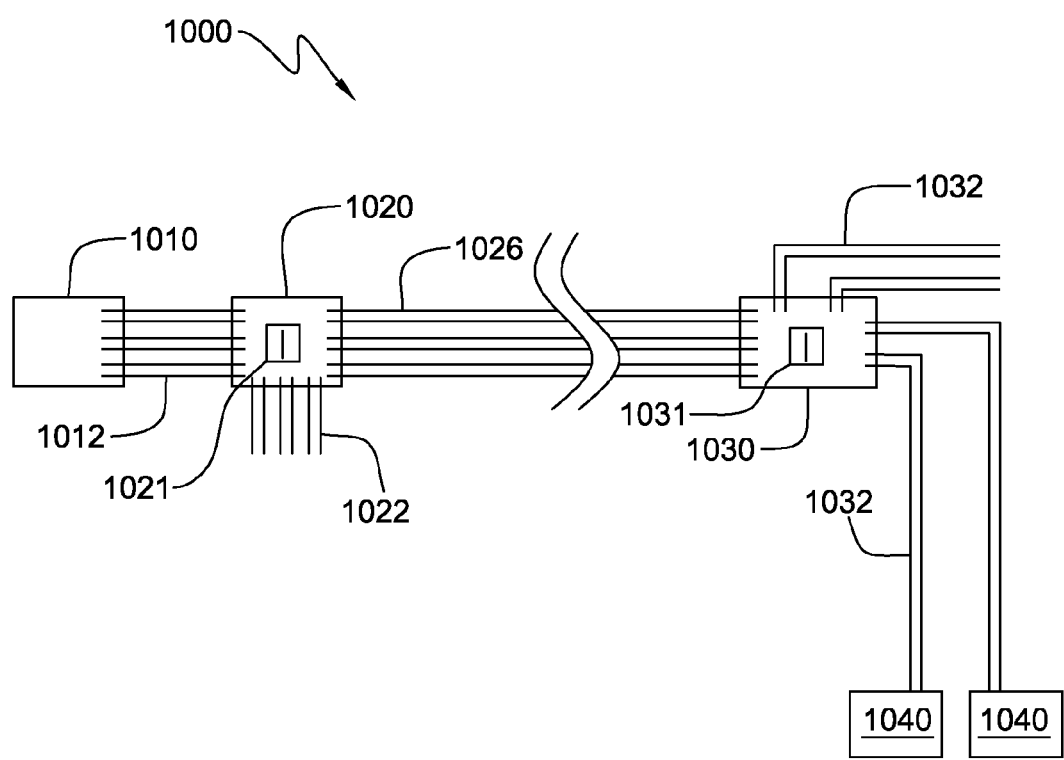
FIG. 10 illustrates one embodiment of a power grid incorporating a low-hysteretic ac loss superconducting tape assembly, in accordance with an aspect of the present invention.

Turning to FIG. 10, a basic schematic of a power grid 1000 is provided. Fundamentally, power grid 1000 includes a power plant 1010, typically housing a plurality of power generators, and transmission lines 1012, to deliver power to a transmission substation 1020. Transmission substation 1020 contains generally a bank of step-up power transformers 1021, which are utilized to step-up voltage of the generated power. Typically, power is generated at a voltage level on the order of thousands of volts, and the transmission substation functions to step-up voltages to the order of 100,000 to 1,000,000 volts in order to reduce line losses. Typical transmission distances are on the order of 50 to 1,000 miles, and power is carried along those distances by power transmission cables 1022, 1026. Power transmission cables 1022, 1026 are routed to a plurality of power substations 1030 (only one of which is shown in FIG. 10). The power substations contain generally a bank of step-down power transformers 1031, to reduce the transmission level voltage from the relatively high values to distribution voltages, typically less than about 10,000 volts. A plurality of further power substations may also be located in a grid-like fashion, provided in localized areas for localized power distribution to end users. However, for simplicity, only a single power substation is shown, noting that downstream power substations may be provided in series. The distribution level power is then transmitted along power distribution cables 1032 to end users 1040, which include commercial end users as well as residential end users. It is also noted that individual transformers may be locally provided for individual or groups of end users. According to a particular feature, at least one of the generators provided in the power plant, the transformers in the transmission substation, the power transmission cable, the transformers provided in the power substation, and the power distribution cables contain a superconducting tape assembly, in accordance with the present description.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A superconducting article comprising:
    a superconducting tape assembly, the superconducting tape assembly comprising:
        a superconducting tape layer comprising at least one superconducting tape; and
        a high permeability magnetic material layer coupled to the superconducting tape layer, the high permeability magnetic material layer being disposed parallel to and covering a main surface of the superconducting tape layer, and wherein the high-permeability magnetic material layer comprises a high-permeability magnetic material which remains magnetically soft at a critical temperature $T_c$ of the at least one superconducting tape, and with presence of an ac magnetic field acting on the superconducting tape assembly, re-magnetizes to divert at least a portion of a normal component of the ac magnetic field therethrough, thereby reducing ac loss in the superconducting tape layer by modifying ac magnetic field distribution within the at least one superconducting tape.

2. The superconducting article of claim 1, wherein the normal component of the ac magnetic field impinges the superconducting tape assembly perpendicular to the main surface of the superconducting tape layer, and the high-permeability magnetic material re-magnetizes to divert at least a portion of the normal component of the ac magnetic field therethrough in a direction parallel to the main surface of the superconducting tape layer.

3. A superconducting article comprising:
    a superconducting tape assembly, the superconducting tape assembly comprising:
        a superconducting tape layer comprising at least one superconducting tape; and
        a high permeability magnetic material layer coupled to the superconducting tape layer, wherein the high-permeability magnetic material layer comprises a high-permeability magnetic material which remains magnetically soft at a critical temperature $T_c$ of the at least one superconducting tape, and with presence of an ac magnetic field acting on the superconducting tape assembly, re-magnetizes to divert at least a portion of a normal component of the ac magnetic field therethrough, thereby reducing ac loss in the superconducting tape layer by modifying ac magnetic field distribution within the at least one superconducting tape, and wherein the high-permeability magnetic material comprises a ferromagnetic glass alloy.

4. The superconducting article of claim 3, wherein the high-permeability magnetic material is an amorphous metal glass material.

5. The superconducting article of claim 4, wherein the at least one superconducting tape comprises a high temperature superconductor (HTS) material, having a critical temperature $T_c$ no less than about 77° K.

6. The superconducting article of claim 4, wherein the superconducting tape assembly is at least partial wound in a coil configuration, with the ac magnetic field passing at least partially longitudinally through The coil configuration, and the normal component of the ac magnetic field being a radial component of the ac magnetic field.

7. The superconducting article of claim 1, wherein each superconducting tape of the at least one superconducting tape comprises a substrate supporting a superconducting region, and wherein the high-permeability magnetic material layer is affixed to the superconducting tape layer with the superconducting region of each superconducting tape of the at least one superconducting tape being disposed adjacent and in opposing relation to a main surface thereof.

8. The superconducting article of claim 1, wherein the high-permeability magnetic material layer comprises a stack of at least two high-permeability magnetic material tapes oriented substantially parallel to the at least one superconducting tape of the superconducting tape layer.

9. The superconducting article of claim 1, wherein the high-permeability magnetic material layer is a first high-permeability magnetic material layer coupled to a first main surface of the superconducting tape layer, and wherein the superconducting tape assembly further comprises a second high-permeability magnetic material layer coupled to a second main surface of the superconducting tape layer, the second high-permeability magnetic material layer comprising the high-permeability magnetic material which remains magnetically soft at the critical temperature $T_c$ of the at least one superconducting tape, and wherein with presence of an ac magnetic field acting on the superconducting tape assembly, re-magnetizes to divert at least a portion of the normal component of the ac magnetic field through the second high-permeability magnetic material layer, the first and the second high-permeability magnetic material layers reducing ac loss in the superconducting tape assembly by modifying ac magnetic field distribution within the at least one superconducting tape.

10. The superconducting article of claim 9, wherein each high-permeability magnetic material layer of the first high-permeability magnetic material layer and the second high-permeability magnetic material layer comprises at least two high-permeability magnetic material tapes disposed in a stack, and wherein each stack is affixed to the superconducting tape layer via a respective adhesive foil.

11. The superconducting article of claim 1, wherein the superconducting tape layer comprises one or more superconducting tapes disposed substantially coplanar and affixed to a first main surface of the high-permeability magnetic material layer, the superconducting tape layer being a first superconducting tape layer, and wherein the superconducting tape assembly further comprises a second superconducting tape layer comprising one or more superconducting tapes disposed substantially coplanar and affixed to a second main surface of the high-permeability magnetic material layer.

12. The superconducting article of claim 11, wherein each superconducting tape of the first superconducting tape layer and the second superconducting tape layer includes a substrate supporting a superconducting region, and wherein the superconducting tapes of the first superconducting tape layer and the second superconducting tape layer are coupled to the high-permeability magnetic material layer with the superconducting region thereof disposed adjacent and in opposing relation to a respective one of the first main surface and the second main surface thereof.

13. The superconducting article of claim 11, wherein the superconducting tape assembly is a stack of layers, and the high-permeability magnetic material layer is a middle high-permeability magnetic material layer in the stack of layers, and the superconducting tape assembly further comprises an upper-high-permeability magnetic material layer and a lower high-permeability magnetic material layer, the upper high-permeability magnetic material layer being affixed to the one or more superconducting tapes of the first superconducting tape layer and the lower high-permeability magnetic material layer being affixed to the one or more superconducting tapes of the second superconducting tape layer, and wherein each high-permeability magnetic material layer comprises the high-permeability magnetic material which remains magnetically soft at the critical temperature $T_c$ of the superconducting tapes of the first superconducting tape layer and the second superconducting tape layer, and with presence of an ac magnetic field acting on the superconducting tape assembly, re-magnetizes to divert at least a portion of a normal component of the ac magnetic field through the high permeability magnetic material layers, thereby reducing ac loss in the first superconducting tape layer and the second superconducting tape layer by modifying ac field distribution therein.

14. The superconducting article of claim 13, wherein the high-permeability magnetic material layers are affixed to the superconducting tape layers employing an adhesive foil, and wherein the superconducting tape layers comprise high-temperature superconducting (HTS) conductors, each having a critical temperature $T_c$ not less than about 77° K, and the high-permeability magnetic material comprises a ferromagnetic glass alloy.

15. A method of fabricating a superconducting article, comprising:
    forming a superconducting tape assembly by:
        providing a superconducting tape layer comprising at least one superconducting tape; and
        affixing a high-permeability magnetic material layer to the superconducting tape layer, the high permeability magnetic material layer being disposed parallel to and covering a main surface of the superconducting tape layer, and wherein the high-permeability magnetic material layer comprises a high-permeability magnetic material which remains magnetically soft at a critical temperature $T_c$ of the at least one superconducting tape, and with presence of an ac magnetic field acting on the superconducting tape assembly, re-magnetizes to divert at least a portion of a normal component of the ac magnetic field therethrough, thereby reducing ac loss in the superconducting tape assembly by modifying ac magnetic field distribution within the at least one superconducting tape.

16. The method of claim 15, wherein the affixing comprises stacking the superconducting tape layer and the high-permeability magnetic material layer with main surfaces thereof disposed in parallel, opposing relation, and wherein the normal component of the ac magnetic field acts on the superconducting tape assembly in a direction perpendicular to a main surface of the superconducting tape layer, and the high-permeability magnetic material layer is selected to re-magnetize to divert at least a portion of the normal component of the ac magnetic field therethrough in a direction parallel to the main surface of the superconducting tape layer.

17. The method of claim 15, wherein the high-permeability magnetic material comprises a ferromagnetic glass alloy.

18. The method of claim 17, wherein the at least one superconducting tape comprises a high-temperature superconductor (HTS) material, having a critical temperature $T_c$ not less than about 77° K.

19. The method of claim 15, further comprising at least partially winding the superconducting tape assembly in a coil configuration, and wherein with the ac magnetic field passing at least partially longitudinally through the coil configuration, the normal component of the ac magnetic field is a radial component of the ac magnetic field.

20. The method of claim 15, wherein each superconducting tape comprises a substrate supporting a superconducting region, and wherein the affixing comprises affixing the high-permeability magnetic material layer to the superconducting tape layer, with the superconducting region of each superconducting tape of the at least one superconducting tape being disposed adjacent and in opposing relation to a main surface thereof.

* * * * *